United States Patent
Lee et al.

(10) Patent No.: US 11,410,724 B2
(45) Date of Patent: Aug. 9, 2022

(54) SEMICONDUCTOR DEVICE AND DATA READING METHOD USING THE SAME

(71) Applicant: Samsung Electronics Co., Ltd., Suwon-si (KR)

(72) Inventors: Dongsoo Lee, Suwon-si (KR); Daehyun Kim, Suwon-si (KR); Guyeon Wei, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/987,618

(22) Filed: Aug. 7, 2020

(65) Prior Publication Data
US 2021/0057030 A1    Feb. 25, 2021

(30) Foreign Application Priority Data
Aug. 21, 2019    (KR) .......................... 10-2019-0102449

(51) Int. Cl.
*G11C 16/08*    (2006.01)
*G11C 16/24*    (2006.01)
(Continued)

(52) U.S. Cl.
CPC ............ *G11C 16/08* (2013.01); *G11C 7/1039* (2013.01); *G11C 16/0425* (2013.01);
(Continued)

(58) Field of Classification Search
CPC ................................................. G11C 14/0054
See application file for complete search history.

(56) References Cited

U.S. PATENT DOCUMENTS 6,097,653 A * 8/2000 Park .......................... G11C 7/06
                                                       365/207
7,099,189 B1 * 8/2006 Plants .................. G11C 11/412
                                                       365/154

(Continued)

FOREIGN PATENT DOCUMENTS

KR    10-2002-0002823 A    1/2002

OTHER PUBLICATIONS

Lee et al., Area Efficient ROM-Embedded SRAM Cache, IEEE Transactions on Very Large Scale Integration (VLSI) Systems, 2012.

(Continued)

*Primary Examiner* — Douglas King
(74) *Attorney, Agent, or Firm* — Jefferson IP Law, LLP

(57) ABSTRACT

A semiconductor device is provided. The device includes a memory that stores data in a non-volatile and volatile manner and a memory controller configured to control the memory. The memory includes a word line pair including a first and second word line, a first bit line pair orthogonal to the first and the second word line and including a first bit line and a first complementary bit line, and a memory cell pair including first and second memory cells adjacent to the first memory cell in a word line direction. A left node of the first memory cell, and a right node of the first memory cell and a left node of the second memory cell, are all connected to the first word line, and a value of the data stored in the memory cell pair in the non-volatile manner is determined according to the selected first word line.

19 Claims, 16 Drawing Sheets

(51) Int. Cl.
  *G11C 7/10*       (2006.01)
  *G11C 16/30*      (2006.01)
  *G11C 16/04*      (2006.01)
  *G11C 16/26*      (2006.01)

(52) U.S. Cl.
  CPC .............. *G11C 16/24* (2013.01); *G11C 16/26* (2013.01); *G11C 16/30* (2013.01)

(56) References Cited

U.S. PATENT DOCUMENTS

| | | | |
|---|---|---|---|
| 7,277,348 B2 * | 10/2007 | Peng | G11C 17/16 |
| | | | 365/129 |
| 8,437,178 B2 * | 5/2013 | Chiu | G11C 11/412 |
| | | | 365/156 |
| 9,552,859 B2 | 1/2017 | Roy et al. | |
| 10,867,674 B1 * | 12/2020 | Lu | G11C 14/0009 |
| 2006/0209593 A1 | 9/2006 | Toda | |
| 2009/0154225 A1 | 6/2009 | Hidaka | |
| 2009/0207642 A1 | 8/2009 | Shimano et al. | |
| 2013/0028010 A1 | 1/2013 | Li et al. | |
| 2013/0141992 A1 * | 6/2013 | Lee | G11C 14/0054 |
| | | | 365/189.14 |
| 2018/0121212 A1 | 5/2018 | Luo et al. | |
| 2018/0174644 A1 * | 6/2018 | Sakhare | G11C 11/1673 |

OTHER PUBLICATIONS

International Search Report dated Nov. 11, 2020, issued in International Patent Application No. PCT/KR2020/010482.
Extended European Search Report dated May 30, 2022, issued in European Patent Application No. 20855590.4.

* cited by examiner

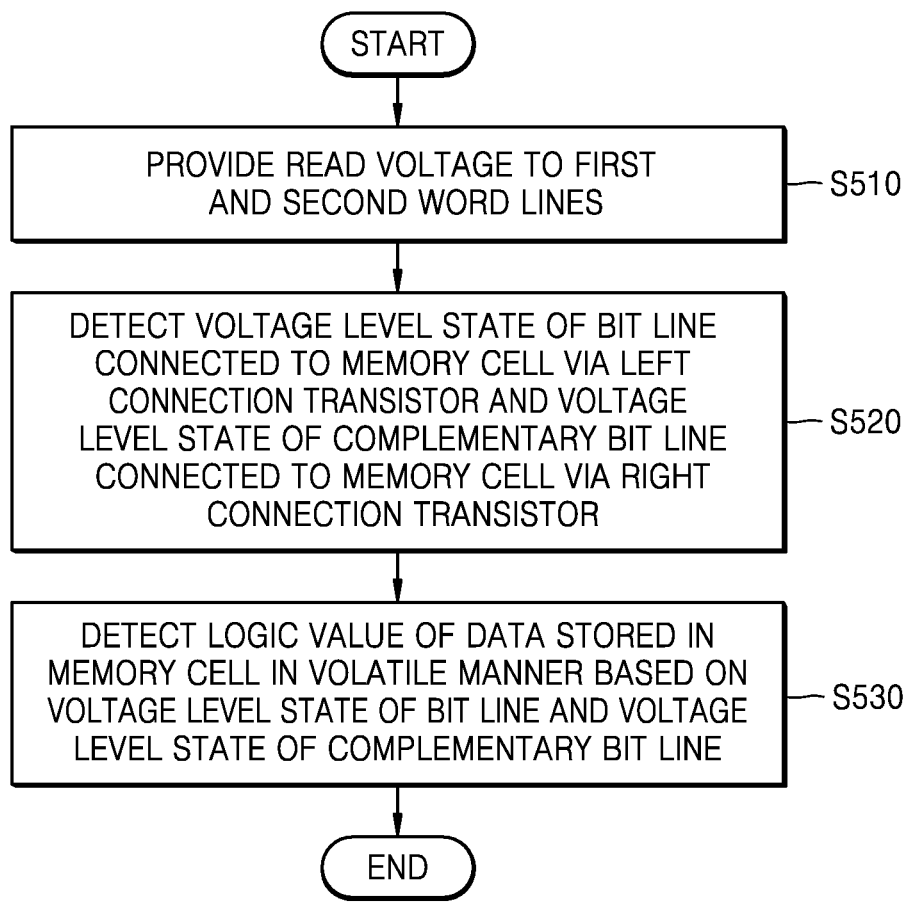

SEMICONDUCTOR DEVICE AND DATA READING METHOD USING THE SAME

CROSS-REFERENCE TO RELATED APPLICATION(S)

This application is based on and claims priority under 35 U.S.C. § 119(a) of a Korean patent application number 10-2019-0102449, filed on Aug. 21, 2019, in the Korean Intellectual Property Office, the disclosure of which is incorporated by reference herein in its entirety.

BACKGROUND

1. Field

The disclosure relates to a semiconductor device and a data reading method using the same. More particularly, the disclosure relates to a method, performed by a semiconductor device, of storing nonvolatile data and volatile data.

2. Description of Related Art

A computer system may include various types of memory systems. In a computer system, a semiconductor device may be used as a main memory. A main memory may include a random access memory (RAM) that is read or written randomly at a fast access speed. A data storage device using a semiconductor may be implemented by using a semiconductor such as silicon (Si), germanium (Ge), gallium arsenide (GaAs), indium phosphide (InP), etc. The semiconductor device may be largely distinguished into a volatile memory device and a non-volatile memory device. The volatile memory device is a memory device in which stored data is erased when power supply is cut off. The non-volatile memory device is a memory device in which stored data is maintained even when power supply is cut off.

The volatile memory device may include static random access memory (SRAM) or dynamic RAM (DRAM). SRAM has lower power consumption and faster operation characteristics than DRAM, and has been widely used for computer cache memory devices or portable electronic products. As a method of using data stored in a memory device has been diversified, a demand for hybrid memory devices capable of storing both non-volatile data and volatile data has increased.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an apparatus and method performed by a semiconductor device, of storing nonvolatile data and volatile data.

Another aspect of the disclosure is to provide a semiconductor device for storing data in a non-volatile manner and a volatile manner.

Additional aspects will be set forth in part in the description which follows and, in part, will be apparent from the description, or may be learned by practice of the presented embodiments of the disclosure.

In accordance with an aspect of the disclosure, a semiconductor device is provided. The device includes a memory storing data in a non-volatile manner and in a volatile manner and a memory controller configured to control the memory. The memory includes a word line pair including a first word line and a second word line, a first bit line pair orthogonal to the first word line and the second word line and including a first bit line and a first complementary bit line, and a memory cell pair including a first memory cell and a second memory cell adjacent to the first memory cell in a word line direction. The first memory cell and the second memory cell each store data in the volatile manner A left node of the first memory cell connected to the first bit line, and a right node of the first memory cell and a left node of the second memory cell that are connected to the first complementary bit line, are all connected to the first word line selected from among the first word line and the second word line, and a value of the data stored in the memory cell pair in the non-volatile manner is determined according to the selected first word line to which the left node of the first memory cell, the right node of the first memory cell, and the left node of the second memory cell are connected.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5 is a flowchart of a method of reading data stored in a memory cell in a volatile manner according to an embodiment of the disclosure;

The same reference numerals are used to represent the same elements throughout the drawings.

DETAILED DESCRIPTION

Figure 1:
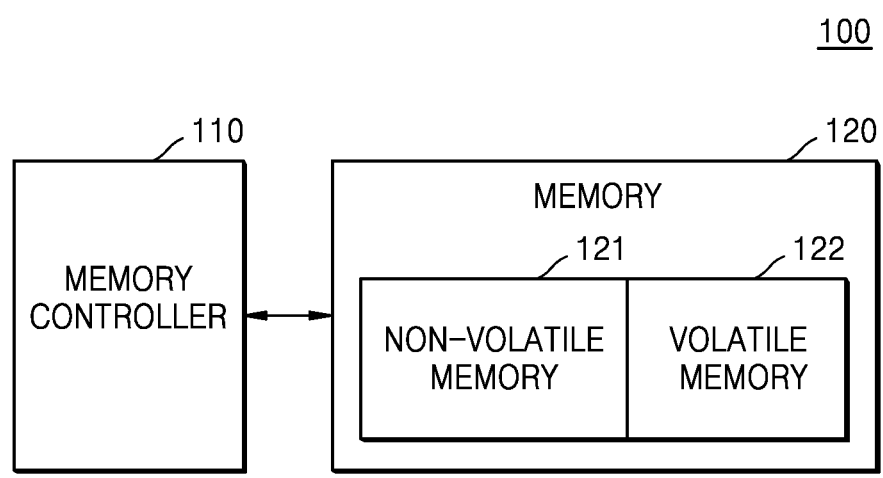
FIG. 1 is a block diagram of a semiconductor device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Throughout the disclosure, the expression "at least one of a, b or c" indicates only a, only b, only c, both a and b, both a and c, both b and c, all of a, b, and c, or variations thereof.

The disclosure may be described in terms of functional block components and various processing steps. Such functional blocks may be realized by any number of hardware and/or software components configured to perform the specified functions. Such functional blocks may be realized by any number of hardware and/or software components configured to perform the specified functions. For example, function blocks of the disclosure may be implemented by one or more microprocessors or by circuit elements for certain functions. Furthermore, for example, the function blocks of the disclosure may be implemented by various programming or scripting languages. Functional aspects may be implemented in algorithms that are executed on one or more processors.

Furthermore, the disclosure could employ any number of conventional techniques for electronics configuration, signal processing and/or control, data processing and the like. Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

Furthermore, terms such as " . . . unit" and " . . . module" stated in the specification may signify a unit to process at least one function or operation and the unit may be embodied by hardware, software, or a combination of hardware and software. The terms such as " . . . unit" and " . . . module" stated in the specification may be stored in a storage medium to be addressable and may be implemented by a program that is executable by a processor.

Furthermore, spatially relative terms, such as "below," "beneath," "lower," "above," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, when the device in the figures is turned over, elements described as "below" or "beneath" other elements or components would then be oriented "above" the other elements or components. Thus, the term "below" or "beneath" can encompass both an orientation of above and below. The device may be otherwise oriented and the spatially relative descriptors used herein interpreted accordingly. When a device is oriented in a different direction (rotated by 90° with respect to another direction), relative descriptions used in the specification may be interpreted according thereto.

The disclosure may, however, be embodied in many different forms and should not be construed as being limited to the embodiments of the disclosure set forth herein; Rather, these embodiments of the disclosure are provided so that this disclosure will be thorough and complete, and will fully convey the concept of the disclosure to those of ordinary skill in the art. Furthermore, the respective embodiments of the disclosure may be operated by being combined with each other, as necessary. For example, parts of one embodiment of the disclosure and another embodiment of the disclosure may be combined with each other and used for an operation of a device.

FIG. 1 is a block diagram of a semiconductor device according to an embodiment of the disclosure.

Referring to FIG. 1, a semiconductor device 100 may include a memory controller 110 and a memory 120.

The semiconductor device 100 may store data in the memory 120. In an embodiment of the disclosure, the semiconductor device 100 may store data in a non-volatile manner. Furthermore, the semiconductor device 100 may store data in a volatile manner. In the specification, storing data in a volatile manner may mean that stored data is erased when power supply to the semiconductor device 100 is cut off. Storing data in a non-volatile manner may mean that stored data is maintained even when power supply to the semiconductor device 100 is cut off.

The memory controller 110 may control the overall operation of the semiconductor device 100. In detail, the memory controller 110 may store data in the memory 120 or read data stored in the memory 120.

The memory 120 may include a non-volatile memory 121 that stores data in the non-volatile manner and a volatile memory 122 that stores data in the volatile manner. The memory controller 110 may read data stored in the non-volatile memory 121 in the non-volatile manner. Furthermore, the memory controller 110 may store data in the volatile memory 122 in the volatile manner or read data stored in the volatile memory 122 in the volatile manner.

The memory controller 110 according to an embodiment of the disclosure may control the memory 120 in response to control information received externally. In an embodiment of the disclosure, the control information may be information that indicates at least one of the non-volatile memory 121 or the volatile memory 122. In an embodiment of the disclosure, the control information may indicate at least one of the non-volatile memory 121 or the volatile memory 122 by using address values of the non-volatile memory 121 and the volatile memory 122. The memory controller 110, in response to the control information, may read the data stored in the memory 120 either in the non-volatile manner or in the volatile manner, or store data in the volatile manner.

In an embodiment of the disclosure, the data stored in the non-volatile memory 121 may be non-variable. Data being non-variable may means that data may not be overwritten by the memory controller 110. In this case, the memory controller 110 may read the data stored in the non-volatile memory 121, but may not perform a data write operation on the non-volatile memory 121. However, the data stored in the non-volatile memory 121 may be overwritten through an operation of changing physical connections of devices included in the non-volatile memory 121.

Although FIG. 1 illustrates that the memory 120 separately includes the non-volatile memory 121 and the volatile memory 122, in the embodiment of the disclosure, the non-volatile memory 121 and the volatile memory 122 may be memories logically divided on a single physical memory. In other words, the non-volatile memory 121 and the volatile memory 122 may overlappingly share the same physical space to store data. Accordingly, the semiconductor device 100 according to the embodiment of the disclosure may efficiently store data stored in the non-volatile manner and data stored in the volatile manner within a limited physical resource.

In detail, the volatile memory 122 according to an embodiment of the disclosure may electrically store data in a memory cell by using the properties of a semiconductor device. In contrast, the non-volatile memory 121 according to an embodiment of the disclosure may store data based on a pattern of a physical connection between circuit elements including a memory cell that stores data electrically, that is, in the volatile manner. The pattern of a physical connection between circuit elements may be maintained regardless of power supply, and may be independent of the data electrically stored in a memory cell.

The memory 120 may include a memory cell array for storing data. The memory cell array may include a plurality of memory cells. In an embodiment of the disclosure, the memory cells may constitute a plurality of memory cell pairs. A memory cell pair may include two memory cells. However, the memory cell array and a method of implementing a memory cell pair are not limited to the above-described example. For example, the memory cell pair may be implemented in the form of a memory cell group including N-number of memory cells.

In a description below, a memory cell included in the semiconductor device 100 is, for example, an SRAM cell. However, the technical characteristics of the disclosure are not limited to the above-described examples, and a person skilled in the art would understand that the technical characteristics of the disclosure are applicable to memory cells of other forms having similar technical characteristics.

Figure 2:
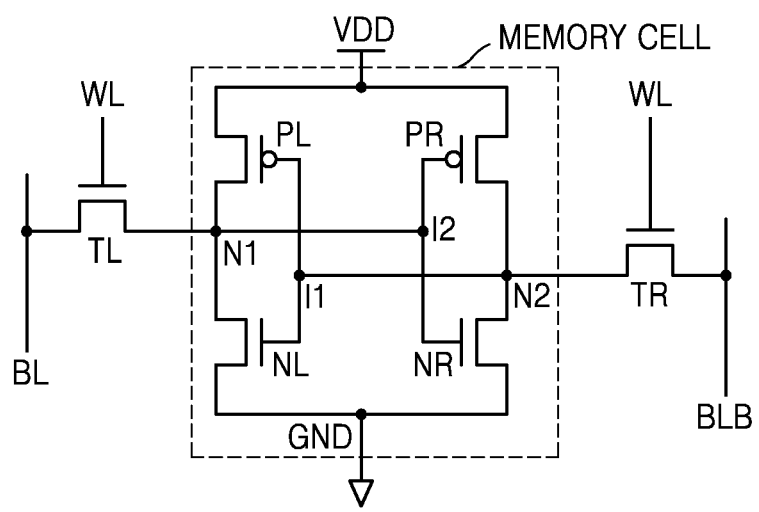
FIG. 2 is an equivalent circuit diagram of a static random access memory (SRAM) cell according to an embodiment of the disclosure.

FIG. 2 is an equivalent circuit diagram of an SRAM cell according to an embodiment of the disclosure.

Referring to FIG. 2, the SRAM cell may be connected, via left connection and right connection transistors TL and TR, to a bit line pair including a bit line BL and a complementary bit line BLB and a word line WL. The SRAM cell may include a plurality of transistors, for example, left load and right load transistors PL and PR and left drive and right drive transistors NL and NR. However, it will be understood by a person skilled in the art that an SRAM cell implementation method may be various in addition to the example of FIG. 2.

In an embodiment of the disclosure, the left load and right load transistors PL and PR may include p-type metal oxide semiconductor (PMOS) transistors. Furthermore, the left connection and right connection transistors TL and TR and the left drive and right drive transistors NL and NR may include n-type metal oxide semiconductor (NMOS) transistors.

Referring to FIG. 2, a gate of each of the left connection transistor TL and the right connection transistor TR may be electrically connected to the word line WL. A drain region of each of the left connection transistor TL and the right connection transistor TR may be electrically connected to the bit line pair BL and BLB. Furthermore, a source region of each of the left load transistor PL and the right load transistor PR may be connected to a first power voltage Vdd, and a source region of each of the left drive transistor NL and the right drive transistor NR may be connected to a second power voltage GND. In this state, the first power voltage Vdd may be a power supply voltage having a high voltage level, and the second power voltage GND may be a ground supply voltage.

In the SRAM cell of FIG. 2, the left load transistor PL and the left drive transistor NL may constitute a first inverter, and the right load transistor PR and the right drive transistor NR may constitute a second inverter.

In this state, a source region of the left connection transistor TL, a drain region of the left load transistor PL, and a drain region of the left drive transistor NL may be electrically commonly connected to a first node N1. The first node N1 that is a left node of the SRAM cell may be an output node of the first inverter. Furthermore, a source region of the right connection transistor TR, a drain region of the right load transistor PR, and a drain region of the right drive transistor NR may be electrically commonly connected to a second node N2. The second node N2 that is a right node of the SRAM cell may be an output node of the second inverter.

In other words, a gate of each of the left load transistor PL and the left drive transistor NL may electrically commonly connected to the second node N2, thereby constituting a first latch circuit. A gate of each of the right load transistor PR and the right drive transistor NR may electrically commonly connected to the first node N1, thereby constituting a second latch circuit.

Referring to FIG. 2, the first node N1 and the second node N2 that are respectively output nodes of the first inverter and second inverters are connected to an input node of another inverter. In other words, the output node N1 of the first inverter is connected to an input node 12 of the second inverter, and an output node N2 of the second inverter is connected to an input node I1 of the first inverter.

Based on the above-described connection structure, the SRAM cell may include the first inverter, the second inverter, and a circuit element CE including a wiring line for connection input/output nodes (nodes N1 and N2) thereof. The circuit element CE may be a flip-flop circuit or a latch circuit as an information accumulation unit that memorizes 1-bit information in the volatile manner.

In the following description, a method of storing data in an SRAM cell in a volatile manner and a method of reading data stored in an SRAM cell in a volatile manner are described.

When the first node N1 of the first inverter is in a high voltage level state, the right drive transistor NR is in an ON state, and accordingly the second node N2 of the second inverter is in a low voltage level state. Accordingly, the left drive transistor NL is in an OFF state, the high voltage level state of the first node N1 may be maintained. In other words, the voltage level states of the first node N1 and the second node N2 may be maintained by a latch circuit that cross-connects the first and second inverters, and accordingly the data stored in the SRAM cell may be maintained during an application of the first power voltage Vdd.

To store data in the SRAM cell, a voltage of a high level may be applied to the word line WL. Furthermore, voltages having complementary levels to each other may be applied to the bit line BL and the complementary bit line BLB included in the bit line pair BL and BLB, based on a value of data to be stored in the volatile manner. For example, when a data value "1" is to be stored, a high level voltage may be applied to the bit line BL, whereas a low level voltage may be applied to the complementary bit line BLB. When a data value "0" is to be stored, a low level voltage may be applied to the bit line BL, whereas a high level voltage may be applied to the complementary bit line BLB. The left connection and right connection transistors TL and TR are in an ON state based on a voltage of the word line WL, and accordingly the voltage level states of the bit line pair BL and BLB may be applied to the first and second nodes N1 and N2. A value of data stored in the SRAM cell in the volatile manner may be detected based on the voltage level states of the first and second nodes N1 and N2. For example, when the first node N1 is in a high voltage level state and the second node N2 is in a low voltage level state, it may be detected later that the data value "1" is stored in the SRAM cell. Alternatively, when the first node N1 is in a low voltage level state and the second node N2 is in a high voltage level state, it may be detected later that the data value "0" is stored in the SRAM cell.

To read data stored in the SRAM cell, a voltage of a high level (hereinafter a read voltage) may also be applied to the word line WL. Furthermore, a precharge voltage may be provided to the bit line pair BL and BLB. The left connection and right connection transistors TL and TR may be in an ON state based on the high level voltage of the word line WL. As the latch circuit and the bit line pair BL and BLB are electrically connected to each other, the voltage level states of the first and second nodes N1 and N2 may appear on the bit line pair BL and BLB. The voltage level state of the bit line pair BL and BLB may be detected as the data stored in the SRAM cell.

Figure 3:
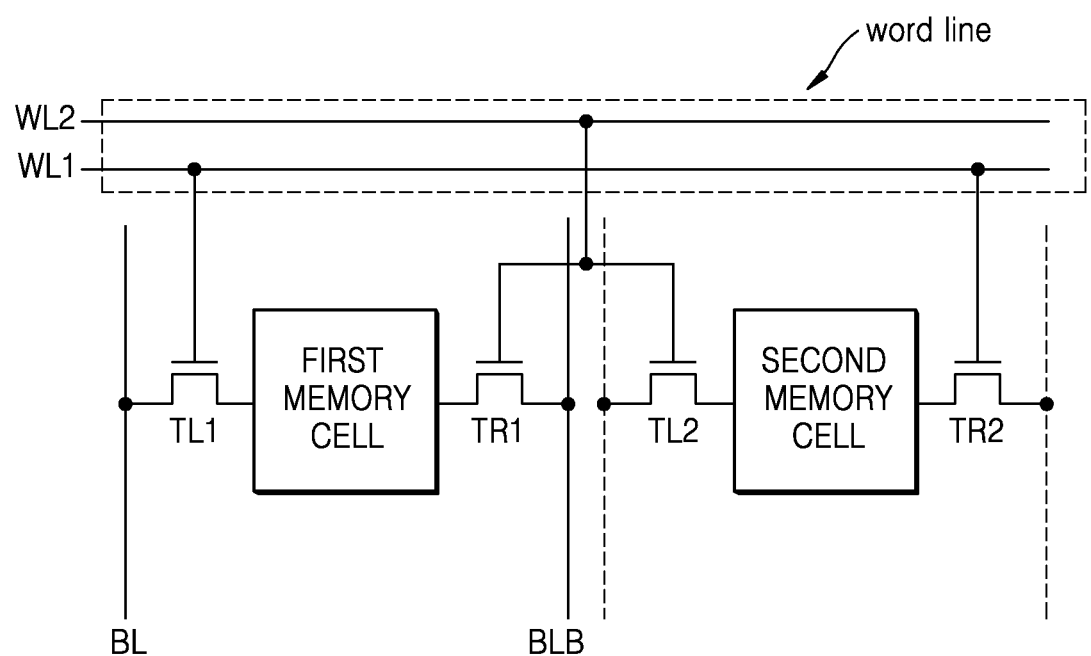
FIG. 3 illustrates a memory cell pair according to an embodiment of the disclosure.

FIG. 3 illustrates a memory cell pair according to an embodiment of the disclosure. A memory cell pair may include two memory cells.

Referring to FIG. 3, a memory cell array including a plurality of memory cell pairs may have a cross point structure. A cross point structure may mean a structure in which one memory cell is formed in a region where at least one word line and at least one bit line intersect each other.

The memory cell array may have a three-dimensional stack structure. The three-dimensional stack structure may mean a structure in which a plurality of memory cell layer including a plurality of memory cells are vertically stacked. When a memory cell array has a three-dimensional stack structure, each memory cell layer may have a cross point structure, but the disclosure is not limited thereto.

The memory cell pair of FIG. 3 may store 2-bit data in the volatile manner by using a first memory cell and a second memory cell. Furthermore, the memory cell pair may store 2-bit data in the non-volatile manner by using a physical connection pattern of the first memory cell and a physical connection pattern of the second memory cell.

Referring to FIG. 3, the memory cell pair may be connected to a word line pair including a plurality of word lines to store data in the non-volatile manner, which is described below in detail with reference to the drawings.

The memory cell pair may be electrically connected to a word line pair including a first word line WL1 and a second word line WL2 and a bit line pair including the bit line BL and the complementary bit line BLB. As described above, the memory cell pair may include the first memory cell and the second memory cell. In an embodiment of the disclosure, each memory cell may be the memory cell of FIG. 2 that stores 1-bit data in the volatile manner.

First and second left connection transistors TL1 and TL2 of each memory cell included in the memory cell pair may be connected to one word line selected from among word lines included in the word line pair, based on data to be stored in the memory cell in the non-volatile manner. In this state, the gate of the left connection transistor being connected to a specific word line may mean that the gate of the left connection transistor is electrically connected to a specific word line via a contact.

In detail, each memory cell may store 1-bit data in the non-volatile manner based on a word line to which the gate of the left connection transistor is connected. For example, the left connection transistor of a memory cell being connected to the first word line WL1 may mean that the data value "0" is stored in the memory cell. Furthermore, the left connection transistor of a memory cell being connected to the second word line WL2 may mean that the data value "1" is stored in the memory cell. Referring to FIG. 3, it is exemplarily illustrated that the first memory cell and the second memory cell respectively store the data value "1" and the data value "0" in the non-volatile manner. In other words, in the structure of FIG. 3, the memory cell pair may store a data value "10" in the non-volatile manner.

Each piece of data stored in the memory cell in a non-volatile manner may be maintained while a word line connected to the left connection transistor of each memory cell remains unchanged. As the left connection transistor of each memory cell and the word line are connected to each other via a contact that is physically formed, the data stored in the memory cell in a non-volatile manner may be maintained even when power supply to the semiconductor device 100 is cut off.

The memory cell pair according to an embodiment of the disclosure may store data in the memory cell in a volatile manner described in FIG. 2 and also store data in the memory cell in a non-volatile manner by using the word line connected to the memory cell. As FIG. 3 illustrates that the memory cell pair includes two memory cells, 2-bit data may be stored in the volatile manner and in the non-volatile manner. It will be understood by a person skilled in the art that, as the number of memory cells included in the memory cell pair illustrated in FIG. 3, when the memory cell pair includes N-number of memory cells, N-bit data may be stored in the volatile manner and in the non-volatile manner. In other words, the memory cell pair may store 2N-bit data by using the N-number of memory cells. In designing a memory cell array, as adding a word line does not much affect the layout of a device, the memory cell pair may efficiently store additional data in the non-volatile manner by adding one word line.

In designing a memory cell array, to improve a degree of integration, transistors, word lines, and bit lines included in the memory cell array are efficiently arranged on a substrate. In this state, to implement an efficient layout, the left connection transistor and the right connection transistor of memory cells adjacent in a word line direction may share a contact connected to the word line. In other words, the left connection transistor and the right connection transistor of memory cells adjacent in a word line direction may be connected to the same word line. Additionally, the first left connection transistor TL1 and a second right connection transistor TR2 may be connected to the same word line.

Accordingly, as illustrated in FIG. 3, a first right connection transistor TR1 of a first memory cell and a second left connection transistor TL2 of a second memory cell may be connected to the same word line, that is, the first word line WL1.

According to the above-described layout, a word line to which the second left connection transistor TL2 of the second memory cell is connected is detected based on a logic value of data to be stored in the second memory cell in the non-volatile manner Thus, the word line to which the first right connection transistor TL1 of a first memory cell adjacent to the second memory cell is connected may be detected to be the same word line based on the word line to which the second left connection transistor TL2 of the second memory cell is connected.

Figure 4A:
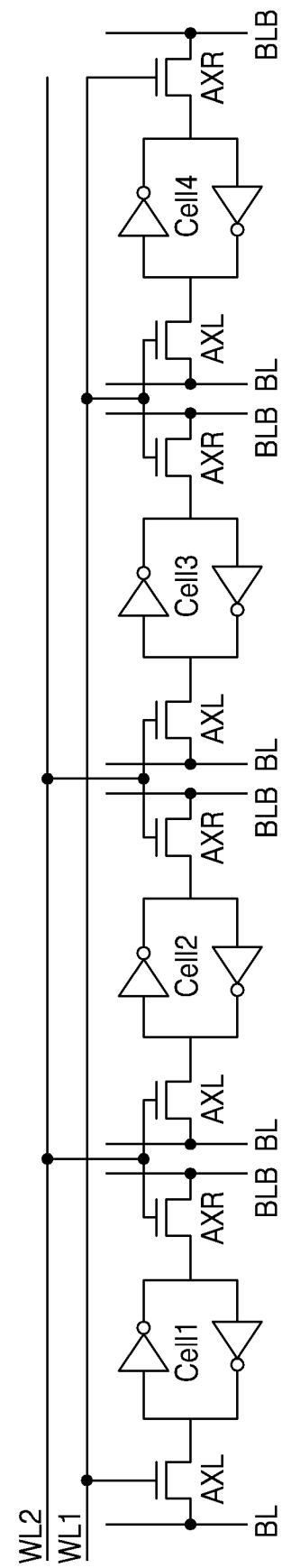
FIG. 4A illustrates memory cell pairs that store 4-bit data in a non-volatile manner according to an embodiment of the disclosure.

FIG. 4A illustrates an embodiment of the disclosure of memory cell pairs that store 4-bit data in the non-volatile manner. Each memory cell pair of FIG. 4A may be the memory cell pair of FIG. 3.

Referring to FIG. 4A, for example, a first memory cell pair including a first memory cell (Cell1) and a second memory cell (Cell2) stores data "01" in the non-volatile manner, and a second memory cell pair including a third memory cell (Cell3) and a fourth memory cell (Cell4) stores data "10" in the non-volatile manner.

As described above, for an efficient layout, a left connection transistor AXL and a right connection transistor AXR of memory cells adjacent in a word line direction connected to the same word line. Accordingly, the right connection transistor AXR of the first memory cell Cell1 and the left connection transistor AXL of the second memory cell Cell2 may be connected to the same word line, that is, the second word line WL2, the right connection transistor AXR of the second memory cell Cell2 and the left connection transistor AXL of the third memory cell Cell3 may be connected to the same word line, that is, the second word line WL2, and the right connection transistor AXR of the third memory cell Cell3 and the left connection transistor AXL of the fourth memory cell Cell4 may be connected to the same word line, that is, the first word line WL1.

Figure 4B:
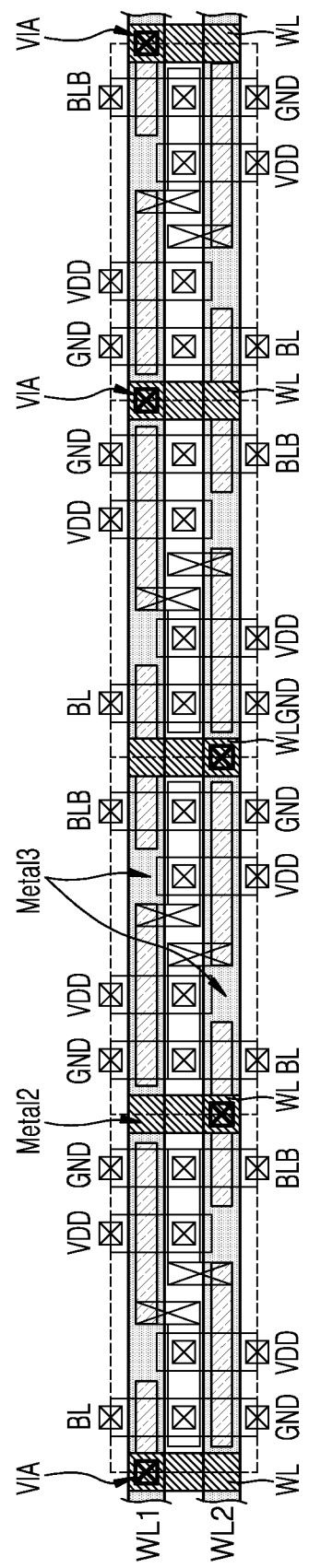
FIG. 4B illustrates a structure of the memory cell pairs of FIG. 4A according to an embodiment of the disclosure.

FIG. 4B illustrates a structure of the memory cell pairs of FIG. 4A. In detail, FIG. 4B is a plan view of the memory cell pairs of FIG. 4A.

Referring to FIG. 4B, the left connection transistor and the right connection transistor in adjacent memory cells are arranged to share a contact via that is connected to the word line. By using the above layout, the memory cell pairs may be efficiently arranged in a limited space while being connected to one of a plurality of word lines formed in parallel via a contact via.

Figure 6:
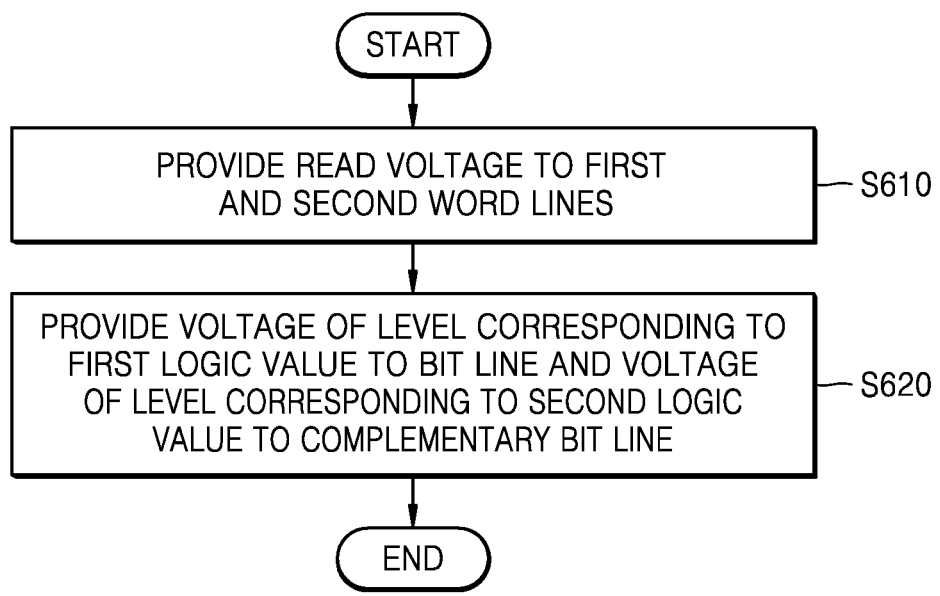
FIG. 6 is a flowchart of a method of storing data in a memory cell in a volatile manner according to an embodiment of the disclosure.
Figure 7:
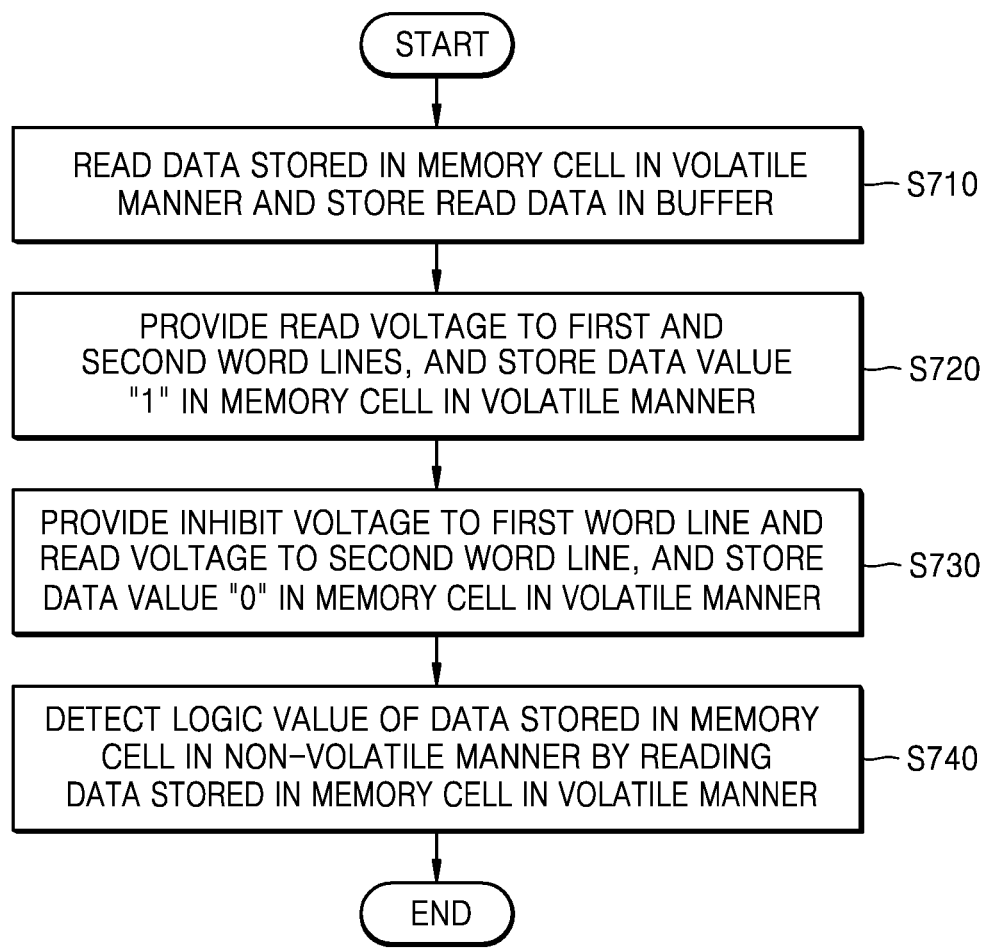
FIG. 7 is a flowchart of a method of reading data stored in a memory cell in a non-volatile manner according to an embodiment of the disclosure.

FIGS. 5 to 7 are flowcharts of a method of storing data in the memory cell of FIG. 3 or reading the stored data.

FIG. 5 is a flowchart of a method of reading data stored in a memory cell in a volatile manner, according to an embodiment of the disclosure.

Referring to FIG. 5, in operation S510, a read voltage may be provided to first and second word lines. In an embodiment of the disclosure, a read voltage may be a high enough voltage to make transistors in an ON state, a gate of each of the transistors being connected to a word line to which a read voltage is provided. In operation S510, as the read voltage is provided to all word lines, regardless of the word lines to which the left connection transistor and the right connection transistor are connected, both of the left connection transistor and the right connection transistor of a memory cell are in an ON state.

In operation S520, a voltage level state of a bit line connected to the memory cell via the left connection transistor and a voltage level state of a complementary bit line connected to the memory cell via the right connection transistor are detected. In an embodiment of the disclosure, a precharge voltage or a precharge current may be provided in advance to the bit line and the complementary bit line.

As the left connection transistor is in an ON state, the voltage level state of a left node of the memory cell may appear on the bit line. Identically, as the right connection transistor is in an ON state, a voltage level state of a right node of the memory cell may appear on the complementary bit line. As described with reference to FIG. 2, as the left node and the right node of a memory cell are connected by the inverter and have opposite voltage level states, the voltage level state of the bit line and the voltage level state of the complementary bit line may also be opposite to each other.

In operation S530, based on the voltage level state of the bit line and the voltage level state of the complementary bit line, the logic value of data stored in a memory cell in a volatile manner may be detected. For example, when the voltage level state of the bit line is in a high voltage level state and the voltage level state of the complementary bit line is in a low voltage level state, it may be detected that a logic value "1" is stored in the memory cell. The logic values "1" and "0" are correspond to data values "1" and "0" stored in the memory cell. In contrast, when the voltage level state of the bit line is in a low voltage level state and the voltage level state of the complementary bit line is in a high voltage level state, it may be detected that a logic value "0" is stored in the memory cell.

FIG. 6 is a flowchart of a method of storing data in a memory cell in a volatile manner according to an embodiment of the disclosure.

Referring to FIG. 6, in operation S610, a write voltage is provided to the first word line and the second word line. In an embodiment of the disclosure, the write voltage may be a high enough voltage to make transistors in an ON state, a gate of each of the transistors being connected to a word line. The write voltage may be a voltage of the same level as that of the read voltage, but the technical characteristics of the disclosure are not limited thereto. As the write voltage is provided to all word lines, regardless of the word lines to which the left connection transistor and the right connection transistor are connected, both of the left connection transistor and the right connection transistor are in an ON state.

In operation S620, a voltage of a level corresponding to a logic value of data is provided to the bit line, and a voltage of a level corresponding to a logic value opposite to the logic value of the data is provided to the complementary bit line. For example, assuming that the data value "1" is to be stored in the memory cell in the volatile manner, a voltage of a high level corresponding to the data value "1" may be provided to the bit line, and a voltage of a low level corresponding to the data value "0" may be provided to the complementary bit line. As the left connection transistor is in an ON state, the voltage level state of the bit line may appear on the left node of the memory cell. Identically, as the right connection transistor is in an ON state, the voltage level state of the complementary bit line may appear on the right node of the memory cell.

When an inhibit voltage is provided later to the first and second word lines, both of the left connection transistor and the right connection transistor of the memory cell may be in an OFF state. In an embodiment of the disclosure, the inhibit voltage may be a low enough voltage to make the transistors in an OFF state, a gate of each of the transistors being connected to a word line. For example, the inhibit voltage may be a ground supply voltage. As described with reference to FIG. 2, when both of the left connection transistor and the right connection transistor are in an OFF state, due to a latch structure of a memory cell, the voltage level states of the left node and the right node of the memory cell may be preserved as data stored in the memory cell in a volatile manner while a power voltage is applied to the memory cell.

FIG. 7 is a flowchart of a method of reading data stored in a memory cell in a non-volatile manner according to an embodiment of the disclosure.

Referring to FIG. 7, in operation S710, data previously stored in the memory cell in the volatile manner is stored in a buffer (not shown). In an embodiment of the disclosure, the data stored in the memory cell in the volatile manner may be read out by the method described with reference to FIG. 5 and stored in the buffer.

According to the embodiment of the disclosure of FIG. 7, in a process of reading the data stored in the memory cell in the non-volatile manner, the data stored in the memory cell in the volatile manner may be destroyed. Accordingly, to restore the data stored in the memory cell in the volatile manner, before reading the data stored in the non-volatile manner, the data stored in the memory cell in the volatile manner may be stored in the buffer. Then, when a read operation with respect to the data stored in the non-volatile manner is completed, the semiconductor device may store the data stored in the buffer again in the memory cell in the volatile manner.

In operation S720, a read voltage is provided to the first word line and the second word line, the data value "1" may be stored in the memory cell in the volatile manner. In the operation S720, a method of storing the data value "1" in the memory cell may be the same as the method described with reference to FIG. 6. In other words, a voltage of a high level corresponding to the data value "1" may be provided to the bit line and a voltage of a low level corresponding to the data value "0" may be provided to the complementary bit line, thereby storing the data.

In operation S730, an operation of storing the data value "0" in the memory cell in the volatile manner is performed. In this state, while an inhibit voltage may be provided to the first word line, the read voltage may be provided to the second word line.

In an embodiment of the disclosure, a voltage of a low level corresponding to the data value "0" may be provided to the bit line, and a voltage of a high level corresponding to the data value "1" may be provided to the complementary bit line. Based on the voltage provided to the word lines, only the transistor connected to the second word line may be in an ON state and the transistor connected to the first word line may be in an OFF state. Accordingly, although the data value "0" is stored in the volatile manner in the memory cell in which the left connection transistor is connected to the second word line, the data value "1" stored in the operation S720 may be maintained in the memory cell in which the left connection transistor is connected to the first word line.

In operation S740, the data stored in a memory cell in a volatile manner is read, and a logic value of the data stored in the memory cell in the non-volatile manner may be detected based on the read data. For example, when the data value "0" read from the memory cell, the semiconductor device may detect that the left connection transistor of the memory cell is connected to the second word line. In other words, the semiconductor device may detect that the data value "1" that is a second logic value is stored in the memory cell in the non-volatile manner. In contrast, when the data value "1" is read from the memory cell, the semiconductor device may detect that the left connection transistor of the memory cell is connected to the first word line. In other words, the semiconductor device may detect that the data value "0" that is a first logic value is stored in the memory cell in the non-volatile manner.

According to the data read method described with reference to FIG. 7, in a process of reading the data stored in the memory cell in the non-volatile manner, a process of temporarily storing the data stored in the memory cell in the volatile manner in the buffer and then restoring the stored data may be necessary. Furthermore, a plurality of data storing operations may be requested to read the data stored in the non-volatile manner. Accordingly, more clock cycles may be necessary for reading the data stored in the non-volatile manner than reading the data stored in the volatile manner.

Figure 8:
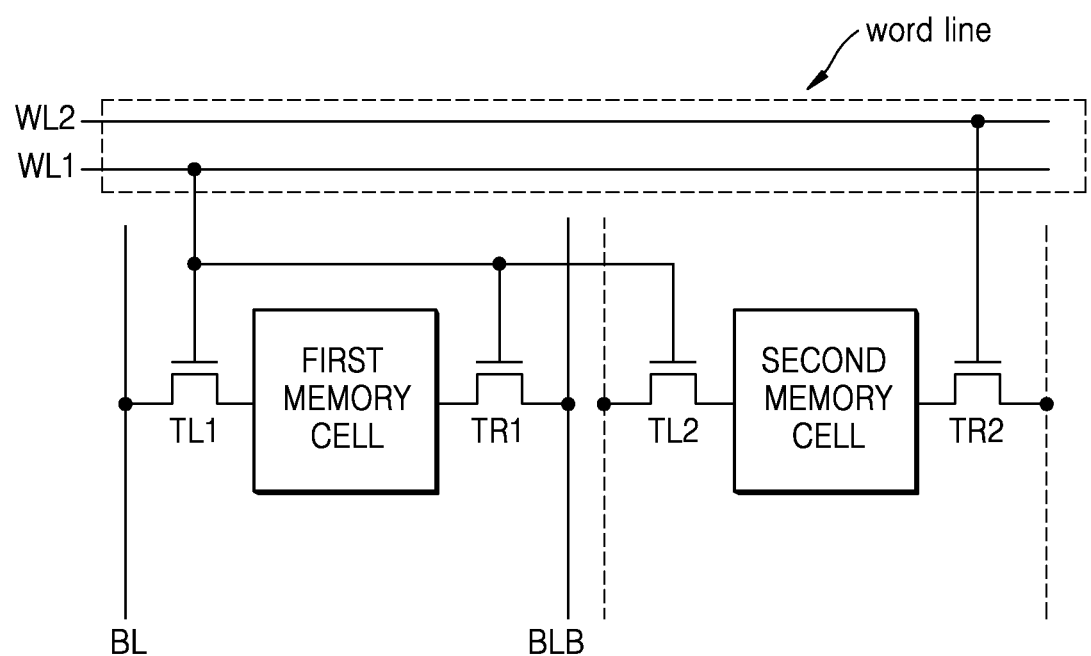
FIG. 8 illustrates a memory cell pair according to an embodiment of the disclosure.

FIG. 8 illustrates a memory cell pair according to an embodiment of the disclosure.

Referring to FIG. 8, to store data in the non-volatile manner, the memory cell pair may be connected to a word line pair including a plurality of word lines. Although FIG. 8 illustrates that a word line pair includes two word lines, and the number of word lines included in the word line pair may vary according to the layout of a substrate and the configuration of a circuit.

The left connection transistor and the right connection transistor of at least one memory cell of the memory cells included in the memory cell pair of FIG. 8, that is, for example, a first memory cell in FIG. 8, may be connected to the same word line, which is described below in detail with reference to the drawings.

The memory cell pair is electrically connected to a word line pair including the first word line WL1 and the second word line WL2 and a bit line pair including the bit line BL and the complementary bit line BLB. Referring to FIG. 8, the memory cell pair may include a first memory cell and a second memory cell.

The memory cell pair of FIG. 8 may store 2-bit data in the volatile manner by using the first memory cell and the second memory cell. Furthermore, the memory cell pair may store 1-bit data in the non-volatile manner by using a physical connection pattern of the first memory cell.

Referring to FIG. 8, to store data in the non-volatile manner, the memory cell pair may be connected to a word line pair including a plurality of word lines, which is described below in detail with reference to the drawings.

The left connection transistor and the right connection transistor of the first memory cell included in the memory cell pair may be connected to one word line of the word lines included in the word line pair, the one word line being selected based on data to be stored in the memory cell pair in the non-volatile manner. In this state, the gates of the left connection transistor and the right connection transistor being connected to a specific word line may mean that the gate of each of the left connection transistor and the right connection transistor are electrically connected to a specific word line via a contact.

In detail, the memory cell pair may store 1-bit data in the non-volatile manner based on a word line to which the gates of the first left connection transistor TL1 and the first right connection transistor TR1 of the first memory cell are connected. For example, the first left connection transistor TL1 and the first right connection transistor TR1 being connected to the first word line WL1 may mean that the data value "0" is stored in the memory cell pair. Furthermore, the first left connection transistor TL1 and the first right connection transistor TR1 being connected to the second word line WL2 may mean that the data value "1" is stored in the memory cell pair. In FIG. 8, the memory cell pair is illustrated, for example, as one storing the data value "1". However, it will be understood by a person skilled in the art that a logic value corresponding to the physical connection pattern of the first memory cell is not limited to the above-described example.

As described above, in order to implement an efficient layout, the left connection transistor and the right connection transistor of the adjacent memory cells may share a contact connected to the word line. Accordingly, the word line connected to the second left connection transistor TL2 of the second memory cell may be chosen based on the word line connected to the first right connection transistor TR1 of the first memory cell.

In other words, according to the embodiment of the disclosure of FIG. 8, all of the first left connection transistor TL1 of the first memory cell, the first right connection transistor TR1 of the first memory cell, and the second left connection transistor TL2 of the second memory cell may be connected to the same word line.

In other words, as the word line to which the second left connection transistor TL2 of the second memory cell is determined based on the word line connected to the first left connection transistor TL1 of the first memory cell, unlike the memory cell pair of FIG. 3, the second memory cell of the memory cell pair of FIG. 8 may not be used to store data in the non-volatile manner.

The data stored in the memory cell pair in the non-volatile manner may be maintained while the data word line connected to the left connection transistor and the right connection transistor of the first memory cell remains unchanged. As the left connection transistor of the first memory cell and the word line are connected to each other via a contact that is physically formed, even when power supply to the semiconductor device 100 is cut off, the data stored in the memory cell pair in the non-volatile manner may be maintained.

Accordingly, while storing data in the first and second memory cells in the volatile manner in the method described with reference to FIG. 2, the memory cell pair may store data in the non-volatile manner by using the word line connected to the first memory cell.

The memory cell pair of FIG. 8 that includes two memory cells may store 2-bit data in the volatile manner. Furthermore, the memory cell pair may store 1-bit data in the non-volatile manner by using the physical connection pattern of the first memory cell. In other words, the memory cell pair may store 3-bit data by using two memory cells. In designing a memory cell array, as adding a word line does not much affect the layout of a device, the memory cell pair may efficiently store additional data in the non-volatile manner by adding at least one word line.

In the memory cell pair of FIG. 8, as the left connection transistor and the right connection transistor of the first memory cell are connected to the same word line, a data write operation with respect to the first memory cell may not be necessary in a process of reading out the data stored in the memory cell pair of FIG. 8 in the non-volatile manner. Accordingly, the data stored in the first memory cell in a volatile manner may not be destroyed in the process of reading out the data stored in the memory cell pair in the non-volatile manner. As it will be described with reference to FIG. 11, a time for an operation of reading out the data stored in the memory cell pair of FIG. 8 in the non-volatile manner may be as short as a time for an operation of reading out the data stored in the volatile manner.

In addition, in the memory cell pair of FIG. 8, as the right connection transistor of the first memory cell and the left connection transistor of the second memory cell are connected to the same word line via the same contact via, the memory cell pair may be disposed on the substrate at a high degree of integration. Accordingly, the memory cell pair of FIG. 8 may be manufactured in a small area with a fast read speed to both of the data stored in the volatile manner and the data stored in the non-volatile manner.

Figure 9:
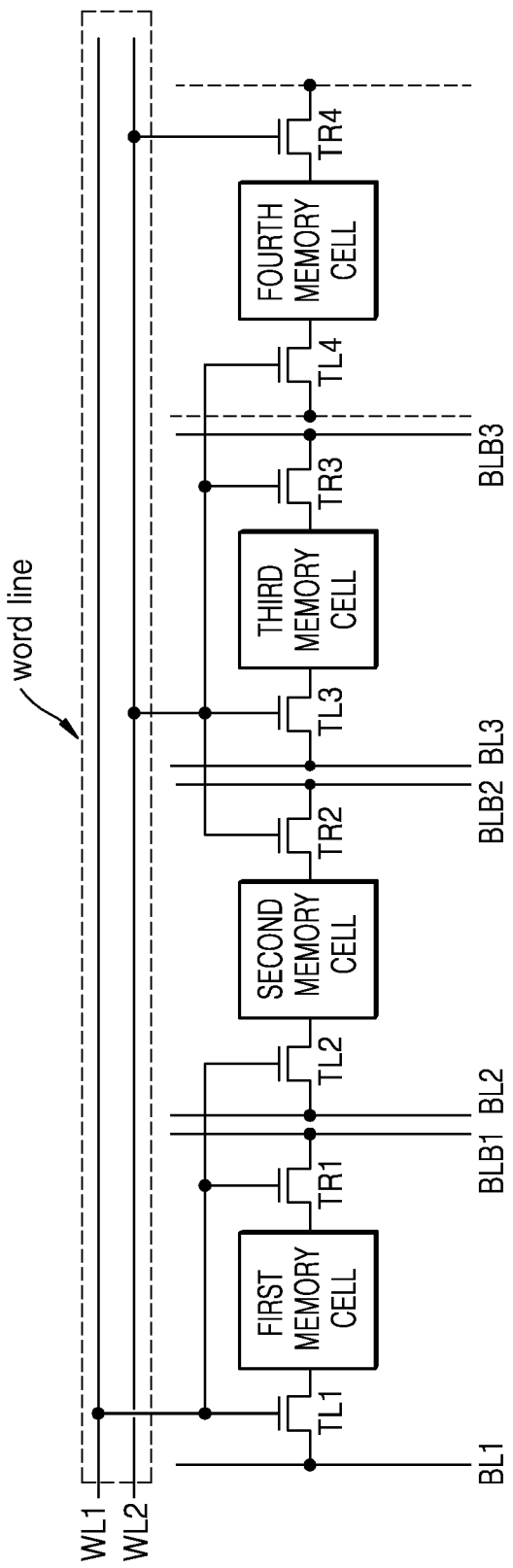
FIG. 9 illustrates a plurality of memory cell pairs according to an embodiment of the disclosure.

FIG. 9 illustrates a plurality of memory cell pairs according to an embodiment of the disclosure. Each memory cell pair may be the memory cell pair described with reference to FIG. 8.

Referring to FIG. 9, to store data in the non-volatile manner, each memory cell pair may be connected to a word line pair including a plurality of word lines. In FIG. 9, for example, a first memory cell pair may include a first memory cell and a second memory cell and a second memory cell pair may include a third memory cell and a fourth memory cell.

Each memory cell may be connected to a word line pair including the first word line WL1 and the second word line WL2. Furthermore, each memory cell may be electrically connected to a bit line pair corresponding to each column. Each bit line pair may include a bit line and a complementary bit line. Referring to FIG. 9, the first memory cell may be connected to a first bit line BL1 and a first complementary bit line BLB1, the second memory cell may be connected to a second bit line BL2 and a second complementary bit line BLB2, the third memory cell may be connected to a third bit line BL3 and a third complementary bit line BLB3, and the fourth memory cell may be connected to a fourth bit line (not shown) and a fourth complementary bit line (not shown).

The memory cell pairs of FIG. 9 may include 4-bit data in the volatile manner by using the first to fourth memory cells. Furthermore, the memory cell pairs may store 2-bit data in the non-volatile manner by using a physical connection pattern of the first memory cell and the third memory cell.

As described with reference to FIG. 8, the word line to which the first left connection transistor TL1 and the first right connection transistor TR1 of the first memory cell are connected is determined to store data in the first memory cell pair in the non-volatile manner. Furthermore, the word line to which a third left connection transistor TL3 and a third right connection transistor TR3 of the third memory cell are connected may be determined to store data in the second memory cell pair in the non-volatile manner. In FIG. 9, the wiring that is determined to store data in the first memory cell pair and the second memory cell pair in the non-volatile manner is indicated by a thick solid line.

In FIG. 9, for example, the first memory cell pair is connected to the first word line WL1, and the second memory cell pair is connected to the second word line WL2. In other words, the memory cell pairs of FIG. 9 are illustrated, for example, as those storing the data value "01" in the non-volatile manner.

As described above, in order to implement an efficient layout, the left connection transistor and the right connection transistor of the adjacent memory cells may share a contact connected to the word line.

Accordingly, in the memory cell pairs of FIG. 9, the word line connected to the second left connection transistor TL2 of the second memory cell may be determined based on the word line connected to the first right connection transistor TR1 of the first memory cell. Furthermore, the word line connected to a second right connection transistor TR2 of the second memory cell may be determined based on the word line connected to the third left connection transistor TR3 of the third memory cell. The word line connected to a fourth left connection transistor TL4 of the fourth memory cell may be determined based on the word line connected to the third right connection transistor TR3 of the third memory cell. In other words, in the memory cell pairs of FIG. 9, the word line connected to a memory cell that is not used to store data in the non-volatile manner may be determined based on the word line connected to a memory cell that is used to store data in the non-volatile manner, which is adjacent to the memory cell. A fourth right connection transistor TR4 connects to the second word line WL2.

The data stored in the memory cell pairs in the non-volatile manner may be maintained while the word line connected to the left connection transistor of the first memory cell and the right connection transistors of the third memory cells remains unchanged. Accordingly, even when power supply to the semiconductor device 100 is cut off, the data stored in the memory cell pairs in the non-volatile manner may be maintained.

Although, in FIG. 9, the data stored in the memory cell pairs in the non-volatile manner is determined based on the word line to which the first and third memory cells are connected, it will be understood by a person skilled in the art that the technical characteristics of the embodiment of the disclosure are not limited to the above-described example. For example, the data stored in the memory cell pairs in the non-volatile manner may be determined based on the word line to which the second and fourth memory cells are connected.

Figure 10:
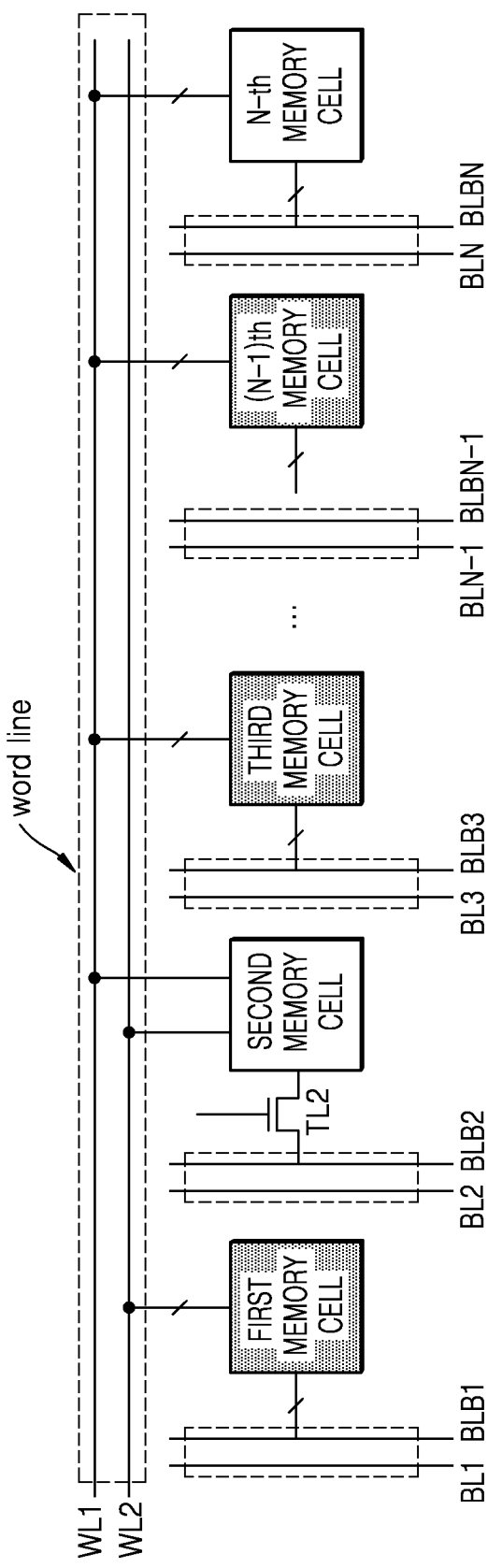
FIG. 10 illustrates a plurality of memory cells according to an embodiment of the disclosure.

FIG. 10 illustrates a plurality of memory cells according to an embodiment of the disclosure.

Referring to FIG. 10, for example, N-number of memory cells constitute a memory cell row in a word line direction. In an embodiment of the disclosure, each memory cell of FIG. 10 may be the memory cell described with reference to FIG. 2. In FIG. 10, each memory cell in the memory cell row may be connected to a word line pair including the first word line WL1 and the second word line WL2. Furthermore, each memory cell may be electrically connected to a bit line pair corresponding to each column. Each bit line pair may include a bit line and a complementary bit line. Although it is briefly illustrated in FIG. 10, it will be understood by a person skilled in the art that each memory cell may be connected to the word line pair and the bit line pair via a drain region (or a source region) and a gate region of each connection transistor.

Referring to FIG. 10, the memory cell row may store N-bit data in the volatile manner by using N-number of memory cells. Furthermore, the memory cell row may store data of a bit less than or equal to N/2 in the non-volatile manner by using N-number of memory cells. In detail, the memory cell row may store m-bit data in the non-volatile manner by using a physical connection pattern of m-number of memory cells that are not adjacent to each other, among the N-number of memory cells, which is described below in detail with reference to the drawings.

In FIG. 10, for example, a first memory cell, a third memory cell, and the (N−1)th memory cell are used to store data in the non-volatile manner.

As described with reference to FIGS. 8 and 9, the left connection transistor and the right connection transistor of a memory cell, which are used to store data in the non-volatile manner, may be connected to the same word line that is selected from among the first word line and the second word line. In FIG. 10, for example, the first memory cell is connected to the second word line WL2, the third memory cell is connected to the first word line WL1, and the (N−1)th memory cell is connected to the first word line WL1. In other words, the memory cell row of FIG. 10 is illustrated, for example, as one storing a data value "100" in the non-volatile manner.

In this state, as described above, in order to implement an efficient layout, the left connection transistor and the right connection transistor of the adjacent memory cells in the word line direction share a contact connected to the word line.

Accordingly, in the memory cell row of FIG. 10, at least one of words lines to which a memory cell used to store data in the non-volatile manner and the adjacent memory cells are connected may be determined based on the word line to which the memory cell used to store data in the non-volatile manner is connected.

For example, the left node of the second memory cell that is an adjacent memory cell of the first memory cell may be connected, via the left connection transistor, to the second word line WL2 that is the same line as the word line to which the first memory cell is connected. In contrast, a right node of the second memory cell may be connected, via the right connection transistor, to the first word line WL1 that is the same word line as the word line to which the third memory cell is connected. In other words, unlike the memory cell used to store data in the non-volatile manner, the left node and the right node of the memory cell that is not used to store data in the non-volatile manner may be connected to different word lines based on the word line to which the respective adjacent memory cells are connected.

Figure 11:
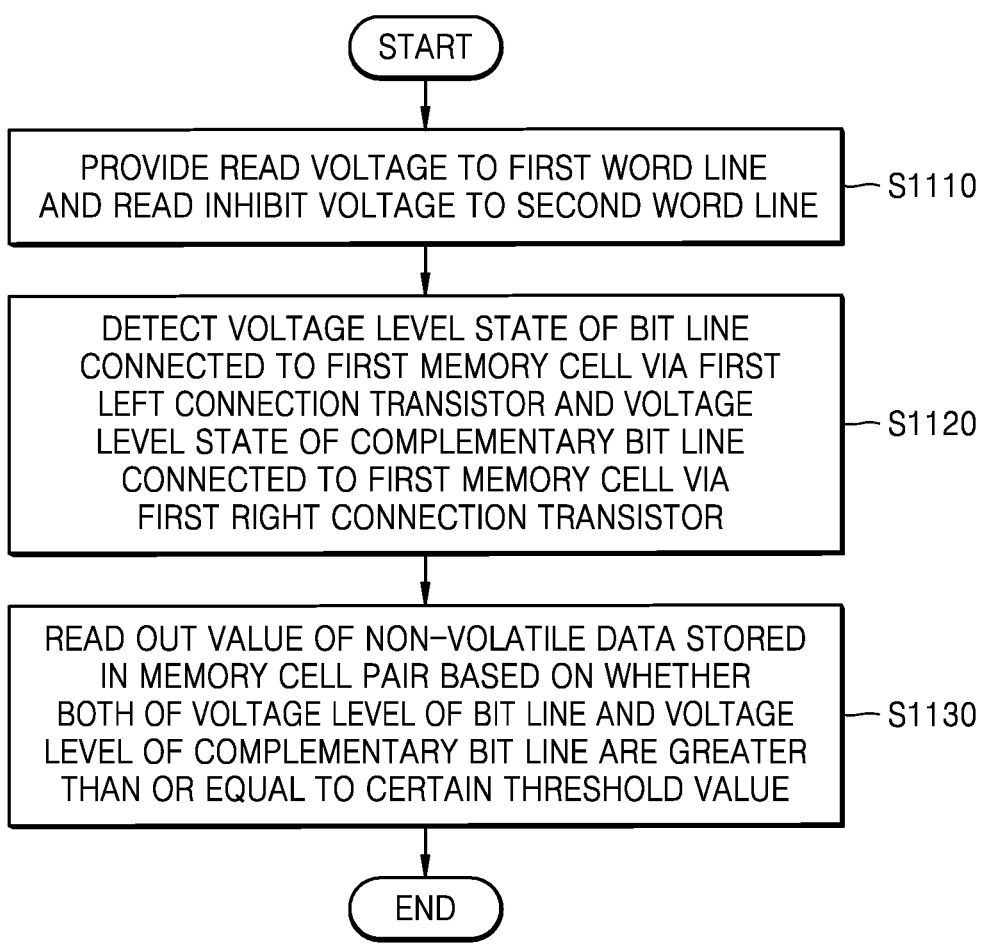
FIG. 11 is a flowchart of a method of reading data stored in a memory cell pair in a non-volatile manner according to an embodiment of the disclosure.

FIG. 11 is a flowchart of a method of reading data stored in a memory cell pair in a non-volatile manner, according to an embodiment of the disclosure. In detail, FIG. 11 is a flowchart of a method of reading the data stored in a memory cell pair in the non-volatile manner which is described with reference to FIG. 8. The read method of FIG. 11 may be identically applied to an operation of reading the data stored in the non-volatile manner in the memory cell row of FIG. 10.

It will be understood by a person skilled in the art that the method of reading the data stored in the memory cell pair in the volatile manner and the method of storing data in the volatile manner, which are described with reference to FIG. 8, may be identical to the method described with reference to FIGS. 5 and 6.

Referring to FIG. 11, in operation S1110, a read voltage is provided to a first word line, and an inhibit voltage is provided to a second word line. Accordingly, a transistor connected to the first word line is in an ON state, and a transistor connected to the second word line is in an OFF state.

In operation S1120, a voltage level state of a bit line connected to the first memory cell via a first left connection transistor and a voltage level state of a complementary bit line connected to the first memory cell via a first right connection transistor may be detected. As described with reference to FIG. 8, both of the first left connection transistor and the first right connection transistor of the first memory cell are connected to the same word line. Accordingly, when the connected word line is the first word line, both of the first left connection transistor and the first right connection transistor are in an ON state, and when the connected word line is the second word line, both of the first left connection transistor and the first right connection transistor are in an OFF state.

When both of the first left connection transistor and the first right connection transistor are in an ON state, the voltage level state of the left node of the first memory cell may appear on the bit line, and the voltage level state of the right node may appear on the complementary bit line. As described with reference to FIG. 2, the left node and the right node of the memory cell are connected to the inverter and have the opposite voltage level states, and thus the voltage level state of the bit line and the voltage level state of the complementary bit line may also be opposite to each other.

In contrast, when both of the first left connection transistor and the first right connection transistor are in an OFF state, the left node and the right node of the first memory cell are not respectively electrically connected to the bit line and the complementary bit line, a high voltage level state that is a precharged voltage may appear on both of the bit line and the complementary bit line.

In operation S1130, a value of non-volatile data stored in the memory cell pair may be read out based on whether both of a voltage level of the bit line and a voltage level of the complementary bit line are greater than or equal to a threshold value.

In other words, when at least one of the bit line or the complementary bit line is in a low voltage level state, the semiconductor device may detect that the word line to which the first memory cell is connected is the first word line. Accordingly, the semiconductor device may detect that a logic value "0" is stored in the memory cell pair in the non-volatile manner.

Furthermore, when both of the bit line and the complementary bit line are in a high voltage level state, the semiconductor device may detect that the word line to which the first memory cell is connected is the second word line. Accordingly, the semiconductor device may detect that a logic value "1" is stored in the memory cell pair in the non-volatile manner.

According to the method described with reference to FIG. 11, the data stored in the memory cell pair in the volatile manner may not be destroyed in a process of reading the data stored in the memory cell pair in the non-volatile manner. Accordingly, the process of temporarily storing the data stored in the memory cell pair in the volatile manner in the buffer and restoring the stored data may not be necessary. Accordingly, the data stored in the non-volatile manner may be read out at an improved speed compared to the method described with reference to FIG. 7.

Figure 12:
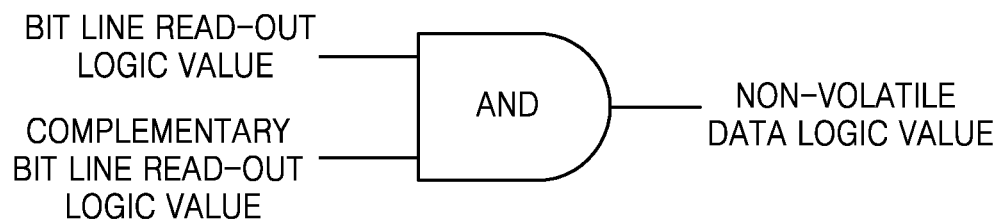
FIG. 12 illustrates a logical expression for detecting data stored in a memory cell pair in a non-volatile manner according to an embodiment of the disclosure.

FIG. 12 illustrates a logical expression for detecting the data stored in the memory cell pair in the non-volatile manner based on the voltage level state of the bit line and the voltage level state of the complementary bit line, in the operation S1130 of FIG. 11.

Referring to FIG. 12, the semiconductor device may detect a value obtained by AND-operating a logic value corresponding to the voltage level state of the bit line and a logic value corresponding to the voltage level state of the complementary bit line, as a logic value of the data stored in the memory cell pair in the non-volatile manner. In other words, when both of the voltage level state of the bit line and the voltage level state of the complementary bit line are in a high voltage level state, the semiconductor device may detect the logic value of the data stored in the memory cell pair in the non-volatile manner to be "1". In contrast, when at least one of the voltage level state of the bit line or the voltage level state of the complementary bit line is in a low voltage level state, the semiconductor device may detect the logic value of the data stored in the memory cell pair in the non-volatile manner to be "0".

In an embodiment of the disclosure, the logical expression of FIG. 12 may be implemented by a AND operation circuit. The sum operation circuit may be implemented by an analog circuit. For example, the sum operation circuit of FIG. 12 may be connected to the bit line and the complementary bit line in an input/output buffer connected to the memory cell array. In another embodiment of the disclosure, the logical expression of FIG. 12 may be implemented digitally. For example, the AND gate of FIG. 12 may be implemented by using an application stored in a computer-readable storage media.

Figure 13:
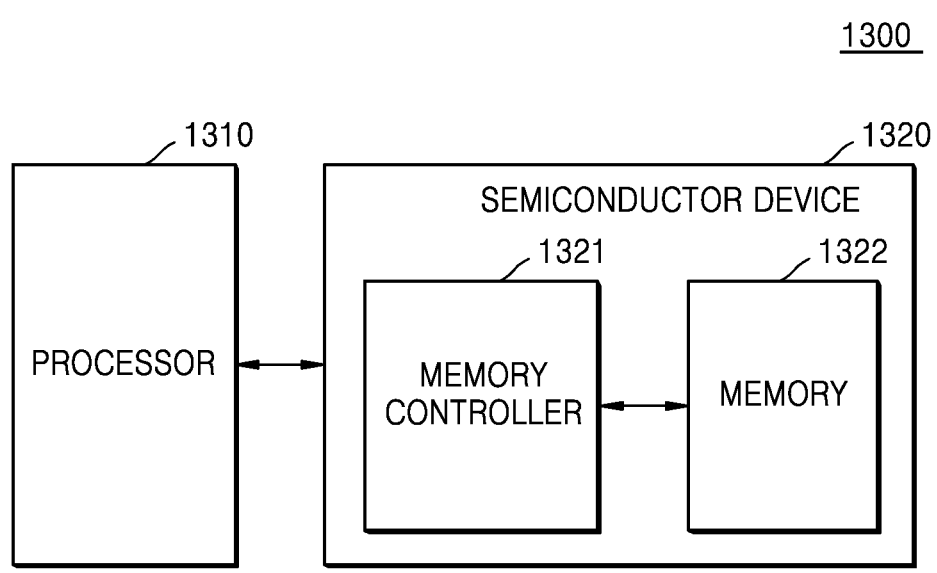
FIG. 13 is a block diagram of an electronic device including a semiconductor device according to an embodiment of the disclosure.

FIG. 13 is a block diagram of an electronic device including a semiconductor device, according to an embodiment of the disclosure.

Referring to FIG. 13, an electronic device 1300 may include a processor 1310 and a semiconductor device 1320.

The processor 1310 may control the overall operation of the electronic device 1300. The processor 1310 may include a central processing unit (CPU) or a microcontroller. Furthermore, in an embodiment of the disclosure, the processor 1310 may be a neural processing unit (NPU). In an embodiment of the disclosure, the processor 1310 may execute an operating system (OS) and applications that perform tasks. The OS or applications performed by the processor 1310 may be stored in the semiconductor device 1320.

Although it is not illustrated, the processor 1310 may be connected to the semiconductor device 1320 via a bus. In an embodiment of the disclosure, the bus may include an address bus, a control bus, and/or a data bus.

The processor 1310 may detect information about a method that has been used to or will be used to store data that is stored or to be stored in the semiconductor device 1320. In an embodiment of the disclosure, a method that has been used to or will be used to store data may include a volatile manner and a non-volatile manner.

The semiconductor device 1320 may be operated as a main memory of the electronic device 1300. The main memory may be a memory that directly exchange data with the processor 1310. The semiconductor device 1320 may store data needed for execution of the processor 1310.

The semiconductor device 1320 may include a memory controller 1321 and a memory 1322. The memory 1322 may include a non-volatile memory and a volatile memory that are logically divided. In an embodiment of the disclosure, while having a space smaller than that of the volatile memory, the non-volatile memory may have an access speed and a read speed similar to those of the volatile memory.

The memory controller 1321 may receive from the processor 1310 information about a method that has been used to or will be used to store data. The memory controller 1321, in response to the received information, may read out data stored in the memory 1322 or store data in the memory 1322.

Figure 14:
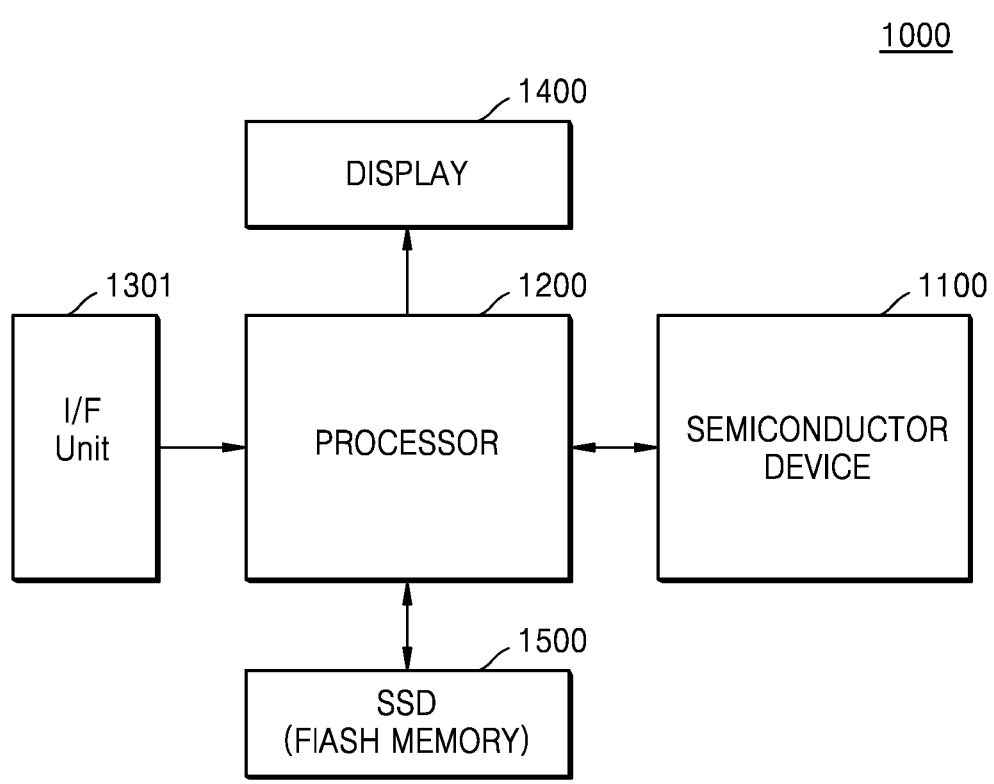
FIG. 14 is a block diagram of an electronic device according to an embodiment of the disclosure.

FIG. 14 is a block diagram of an electronic device according to an embodiment of the disclosure.

Referring to FIG. 14, an electronic device 1000, for example, a notebook computer or a portable electronic device, may include a semiconductor device 1100, a processor 1200, an interface unit 1301, a display 1400, and a solid state drive (SSD) 1500.

In an embodiment of the disclosure, the semiconductor device 1100, the processor 1200, and the SSD 1500 may be manufactured or packaged in a single chip. The semiconductor device 1100 and the SSD 1500 may be embedded in the electronic device.

In an embodiment of the disclosure, the electronic device may be a portable communication device. In this case, a modem and a transceiver that perform functions of modulating/demodulating data and transmitting/receiving communication data may be connected to the interface unit 1301.

The semiconductor device 1100, like the semiconductor device 1100 of FIG. 1, may store data in the non-volatile manner and in the volatile manner and read the stored data. In detail, the semiconductor device 1100 may be connected to the processor 1200, and may function as a main memory of the processor 1200 and store data in a volatile memory region in the volatile manner. Alternatively, the volatile memory region of the semiconductor device 1100 may be used as a cache memory of the electronic device 1000. Furthermore, the semiconductor device 1100 may function as read only memory (ROM) and store data in a non-volatile memory region in the non-volatile manner. As described above, in the embodiment of the disclosure, it will be understood by a person skilled in the art that the volatile memory region and the non-volatile memory region are logically divided regions sharing one physical space.

In the semiconductor device 1100 according to an embodiment of the disclosure, the data stored in the volatile or non-volatile manner may be accessed by a random access method, as described with reference to FIGS. 3 to 8. Accordingly, in the semiconductor device 1100, the data stored in the non-volatile or volatile manner may all be stored or read out at low power and fast speed. In an embodiment of the disclosure, OS related data (OS data) such as a stack where a write event occurs, a heap, a read/write file, etc. may be stored in the volatile memory region of the semiconductor device 1100. As the OS data including a stack that has a high frequency of instant accesses and a high possibility of occurrence of many write events, the processor 1200 may store the OS data in the volatile data region of the semiconductor device 1100 where data may be stored and read out at fast speed, thereby performing an efficient operation.

Codes, RO files, and database of the OS and application programs may be stored in the non-volatile memory region. As the codes and RO files of a program have a low access frequency to data and generally require read accesses, the semiconductor device 1100 may perform an efficient operation by reading out the codes and RO files of a program stored in the non-volatile memory region.

In detail, the semiconductor device 1100 may store boot codes used for driving the electronic device 1000 in the non-volatile memory region in the non-volatile manner. As the semiconductor device 1100 according to an embodiment of the disclosure may read out the data stored in the non-volatile manner at low power and fast speed by using the SRAM cell, driving performance of the electronic device 1000 may be improved. Furthermore, the semiconductor device 1100 may store data about libraries or functions permanently used in the processor 1200 of the electronic device 1000 in the non-volatile memory region in the non-volatile manner. For example, the processor 1200 may read out the data stored in the non-volatile memory region and may use the data for application operation using the volatile memory region as a cache memory. As the data stored in the non-volatile manner in the semiconductor device 1100 may not be overwritten, but be read out at low power and fast speed, it may be appropriate to store permanent values frequently used for the operation of the processor 1200.

The processor 1200 may control the overall operation of the electronic device 1000 according to a preset program. The processor 1200 according to an embodiment of the disclosure may independently access the volatile memory region and the non-volatile memory region of the semiconductor device 1100. The semiconductor device 1100 may include a memory controller for controlling each memory region such that data respectively stored in the volatile memory region and the non-volatile memory region are read out without interference in response to an access of the processor 1200, and a buffer for temporarily storing data.

In an embodiment of the disclosure, the processor 1200 may be an NPU. The processor 1200 may use the volatile memory region of the semiconductor device 1100 as a cache memory for storing data generated in an artificial neural network operation process. In an electronic device such as a deep learning accelerator including the NPU as a processor, non-linear functions of a high complexity such as tan h or sigmoid may be used as activation functions for artificial neural network operations. When a high-order polynomial is used to calculate the functions, an operation time may extend too long, and thus a method of storing a previously operated result in a memory as a table data and loading a necessary value may be used. As a large amount of table data needs to be quickly loaded to efficiently calculate activation functions, the non-volatile memory region of the semiconductor device 1100 may be suitable for storing the table data. Not only the table data of activation functions, but also non-variable data such as libraries and binary codes of a kernel used for artificial neural network calculation may also be stored in the non-volatile memory region of the semiconductor device 1100 used for an operation of the NPU.

The processor 1200 according to an embodiment of disclosure may perform various artificial neural network operation processes. For example, the processor 1200 may perform artificial neural network algorithm operations of various methods such as a convolutional neural network (CNN), a recurrent neural network (RNN), a long short term memory network (LSTM), or gated recurrent units (GRUs).

For example, when an operation using a CNN algorithm is performed, a result of a currently performed operation may be stored in the volatile memory region of the semiconductor device 1100. However, basic features used for the algorithm, or a result of the operation in a low level layer may be previously generated and stored in the non-volatile memory region of the semiconductor device 1100. The processor 1200 may fast and efficiently perform a operation by simplifying the logic operation of a CNN algorithm operation by using the basic features or the operation result of a low level layer stored in the semiconductor device 1100. Although the CNN algorithm is used as an example, it will be understood by a person skilled in the art that the semiconductor device 1100 may be used for various artificial neural network algorithm operations in the same manner.

A process operation of the processor 1200 may include an operation to verify whether the processor 1200 normally operates. The semiconductor device 1100 may store, in the non-volatile memory region in the non-volatile manner, test codes for verifying whether the processor 1200 operates normally in the process operation. The processor 1200 may verify whether a defect occurs in the process operation by using the test codes stored in the semiconductor device 1100.

The display 1400 may include a touch screen as a device such as liquid crystal having a backlight, liquid crystal having an LED light source, or OLED. The display 1400 may function as an output device that displays characters, numbers, or images such as pictures in colors.

The SSD 1500 may include a NOR type or NAND type flash memory. Although FIG. 11 illustrates that an SSD is employed as a storage device, and the type of a storage device in the disclosure is not limited thereto. In the disclosure, the storage device may include various types of non-volatile storages. A non-volatile storage may store data information having various data forms such as text, graphics, or software codes.

In an embodiment of the disclosure, the non-volatile storage may be implemented as, for example, electrically erasable programmable Read-Only memory (EEPROM), flash memory, magnetic RAM (MRAM), spin-transfer torque MRAM, conductive bridging RAM (CBRAM), ferroelectric RAM (FeRAM), phase change RAM (PRAM) called ovonic unified memory (OUM), resistive RAM (RRAM or ReRAM), nanotube RRAM, polymer RAM (PoRAM), nano floating gate memory (NFGM), holographic memory, a molecular electronics memory device, or insulator resistance change memory.

In the above-described embodiment of the disclosure, although the electronic device is mainly described as a mobile communication device, the electronic device may function as a smart card by adding or subtracting constituent components, when necessary, or may be connected to a server to be implemented as a large capacity operation device.

In an embodiment of the disclosure, the electronic device may be connected to an external communication device via a separate interface. The communication device may include a digital versatile disc (DVD) player, a computer, a set top box (STB), a game console, or a digital camcorder.

In an embodiment of the disclosure, the electronic device may be further provided with an application chipset, a camera image processor (CIS), or a mobile DRAM.

In an embodiment of the disclosure, chips for forming an electronic device may be mounted by using various types of packages. For example, the chips may be single-packaged as a package such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), or wafer-level processed stack package (WSP).

Figure 15:
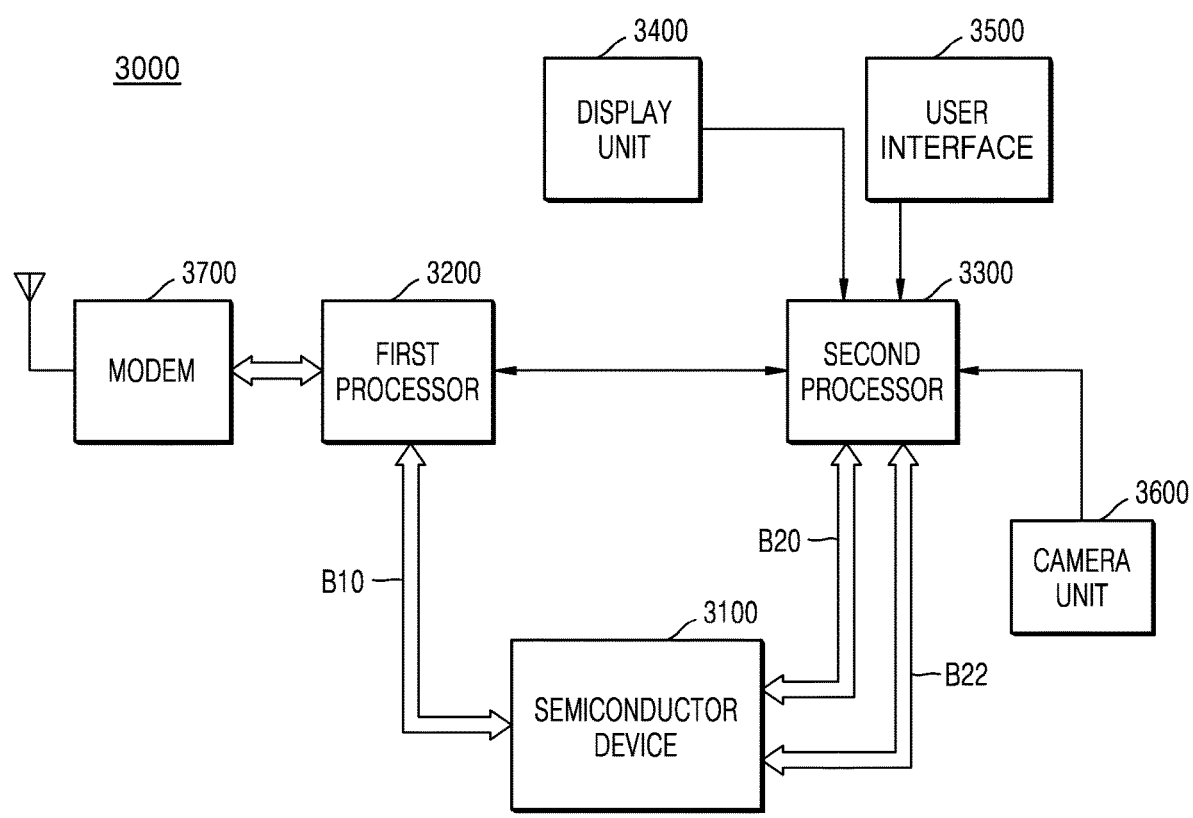
FIG. 15 illustrates a circuit block of an electronic device according to an embodiment of the disclosure.

FIG. 15 illustrates a circuit block of an electronic device, according to an embodiment of the disclosure.

Referring to FIG. 15, an electronic device 3000 may be a portable device that functions as a smart phone. The electronic device 3000 may include a semiconductor device 3100, a first processor 3200, a second processor 3300, a display unit 3400, a user interface 3500, a camera unit 3600, and a modem 3700.

The semiconductor device 3100 may have m-number of ports connected to m-number of buses, for example, first to third buses B10, B20, and B22 in FIG. 12, and may be connected to the first processor 3200 and the second processor 3300. In detail, a first port of the semiconductor device 3100 may be connected via the first bus B10 to the first processor 3200 that may be a baseband processor, and a second port of the semiconductor device 3100 may be connected via the second bus B20 to the second processor 3300 that may be an application processor. Furthermore, a third port of the semiconductor device 3100 may be connected to the second processor 3300 via the third bus B22.

The semiconductor device 3100 may store data in the non-volatile manner and in the volatile manner data and may read the stored data like the semiconductor device 100 of FIG. 1.

In an embodiment of the disclosure, an interface of the first bus B10 may be a volatile memory interface, and the first port may receive first packet data generated from the first processor 3200 and transmit that data to an internal circuit block of the semiconductor device 3100. Furthermore, the first port may provide first data stored in the volatile manner in the semiconductor device 3100 to the first processor 3200. In this case, the first data may be parallel data.

In an embodiment of the disclosure, the interface of the third bus B22 may also be a volatile memory interface, and the third port may receive third packet data generated from the second processor 3300 and transmit the data to the internal circuit block of the semiconductor device 3100. Furthermore, the third port may provide the third data stored in the volatile manner in the semiconductor device 3100 to the second processor 3300.

In an embodiment of the disclosure, the interface of the second bus B20 may be a non-volatile memory interface, and the second port may provide second data stored in the non-volatile manner in the semiconductor device 3100 to the second processor 3300. In this case, the second data may be serial or parallel data.

In an embodiment of the disclosure, the interface of buses may include one of various interface protocols such as a universal serial bus (USB), a multi-media card (MMC), a peripheral component interconnect-express (PCIE), a serial-attached SCSI (SAS), a serial advanced technology attachment (SATA), a parallel advanced technology attachment (PATA), a small computer system interface (SCSI), an enhanced small disk interface (ESDI), and an integrated drive electronics (IDE).

In an embodiment of the disclosure, the first and second processors 3200 and 3300 and the semiconductor device 3100 may be manufactured or packaged in a single chip, when necessary. Furthermore, the semiconductor device 3100 may be embedded in an electronic device.

In an embodiment of the disclosure, when a portable device is a smart phone, the modem 3700 for performing functions of transceiving of communication data and data modulation/demodulation may be connected to functions the first processor 3200.

For large capacity information storing, a NOR type or NAND type flash memory may be additionally connected to the first processor 3200 or the second processor 3300.

The display unit 3400 may include a touch screen as a device such as liquid crystal having a backlight, liquid crystal having an LED light source, or OLED. The display unit 3400 may function as an output device that displays characters, numbers, or images such as pictures in colors.

Although in the above-described embodiment of the disclosure, the electronic device 3000 is mainly described as a smart phone device, the electronic device 3000 may function in various forms such as a smart card by adding or omitting constituent components, when necessary.

In an embodiment of the disclosure, the electronic device 3000 may be connected to an external communication device through a separate interface. The communication device may include a DVD player, a computer, a STB, a game console, or a digital camcorder. The camera unit 3600 may include a CIS and may be connected to the second processor 3300.

In an embodiment of the disclosure, the camera unit 3600 may be further provided with an application chipset or a mobile DRAM.

Some embodiments of the disclosure may be implemented by a S/W program including instructions stored in a computer-readable storage medium.

For example, a computer, which is a device capable of calling the stored instructions from a storage medium and operating according to an embodiment of the disclosure in response to the called instructions, may include a device according to embodiments of the disclosure or an external server communication-connected to the device.

A computer-readable storing medium may be provided in the form of a non-transitory storage medium. The term "non-transitory" may signify that a storage medium does not include a signal or a current, but is tangible, and may signify that data is stored in a storage medium regardless of being stored semi-permanently or temporarily. For example, a non-transitory storage medium may include not only non-transitory readable storage media such as CDs, DVDs, hard discs, Bluray discs, USBs, embedded memories, memory cards, ROM or RAM, but also temporary storage media such as registers, caches, or buffers.

Furthermore, the methods according to the embodiments of the disclosure may be provided as computer program products.

The computer program product may include an S/W program, a computer-readable storage medium in which the S/W program is stored, or a product traded between a seller and a buyer.

For example, the computer program product may include a product, e.g., a downloadable application, in the form of an S/W program distributed electronically through device manufacturers or electronic markets, e.g., Google Play Store or App Store. For electronic distribution, at least a part of a S/W program may be stored on a storage medium or temporarily generated. In this case, the storage medium can be a manufacturer, a server of an electronic market, or a storage medium of a relay server.

While the disclosure has been shown described with reference to various embodiments thereof, it will be understood by those skilled in the art that various changes in form and details may be made therein without departing from the spirit and scope of the disclosure as defined by the appended claims and their equivalents.

What is claimed is:

1. A semiconductor device comprising:
   a memory storing data in a non-volatile manner and in a volatile manner; and
   a memory controller configured to control the memory, wherein the memory comprises:
   a word line pair comprising a first word line and a second word line,
   a first bit line pair orthogonal to the first word line and the second word line and comprising a first bit line and a first complementary bit line,
   a memory cell pair comprising a first memory cell and a second memory cell adjacent to the first memory cell in a word line direction, the first memory cell and the second memory cell each storing data in the volatile manner,
   a left node of the first memory cell connected to the first bit line, and a right node of the first memory cell that are connected to the first complementary bit line and a left node of the second memory cell, are all connected to the first word line selected from among the first word line and the second word line, and
   a value of data stored in the memory cell pair in the non-volatile manner is determined according to the selected first word line to which the left node of the first memory cell, the right node of the first memory cell, and the left node of the second memory cell are connected.

2. The semiconductor device of claim 1,
   wherein the memory controller is further configured to:
   provide a read voltage to the first word line,
   provide a read inhibit voltage to the second word line,
   detect a voltage level of the first bit line connected to the first memory cell and a voltage level of the first complementary bit line connected to the first memory cell, and
   determine the value of the data stored in the memory cell pair in the non-volatile manner on the basis of whether both of the voltage level of the first bit line and the voltage level of the first complementary bit line are greater than or equal to a threshold value,
   wherein the memory further comprises:
   a left connection transistor that connects the left node of the first memory cell to the first bit line; and
   a right connection transistor that connects the right node of the first memory cell to the first complementary bit line, and
   wherein a gate region of the left connection transistor and a gate region of the right connection transistor are connected together to the selected first word line, and both of the left connection transistor and the right connection transistor are turned on or off in response to a voltage applied to the selected first word line.

3. The semiconductor device of claim 2, wherein the read voltage corresponds to a power supply voltage and the read inhibit voltage corresponds to a ground supply voltage.

4. The semiconductor device of claim 2, wherein the memory controller is further configured to detect the value of the data stored in the memory cell pair in the non-volatile manner to be 1 when both of the voltage level of the first bit line and the voltage level of the first complementary bit line are greater than or equal to the threshold value.

5. The semiconductor device of claim 1, wherein each of the first memory cell and the second memory cell comprises a static random access memory (SRAM) cell.

6. The semiconductor device of claim 1, wherein each of the first memory cell and the second memory cell comprises a latch circuit including four transistors.

7. The semiconductor device of claim 1,
   wherein the right node of the first memory cell is electrically connected to the first word line through a gate region of a right connection transistor of the first memory cell, and wherein the left node of the first memory cell is electrically connected to the first word line through a gate region of a left connection transistor of the first memory cell.

8. The semiconductor device of claim 7, wherein the right node of the first memory cell and the left node of the second memory cell are electrically connected to each other through the right connection transistor of the first memory cell and a left connection transistor of the second memory cell.

9. The semiconductor device of claim 8, wherein the right node of the first memory cell and the left node of the second memory cell are electrically connected to each other through a contact via formed between the gate region of the right connection transistor of the first memory cell and a gate region of the left connection transistor of the second memory cell.

10. The semiconductor device of claim 1, further comprising:
a sum operation circuit connected to the first bit line and the first complementary bit line and configured to perform a sum operation of logic values corresponding to voltage levels on the first bit line and the first complementary bit line.

11. A method, performed by a semiconductor device, of reading out data stored in a memory in a non-volatile manner, the method comprising:
providing a read voltage to a first word line and a read inhibit voltage to a second word line, with respect to a word line pair comprising the first word line and the second word line;
detecting a voltage level of a first bit line connected to a first memory cell included in the memory and a voltage level of a first complementary bit line connected to the first memory cell;
reading out a value of the data stored in the first memory cell in the non-volatile manner on the basis of whether both of a voltage level of the first bit line and a voltage level of the first complementary bit line are greater than or equal to a threshold value; and
detecting a value of data stored in a memory cell pair in the non-volatile manner to be 1 when both of the voltage level of the first bit line and the voltage level of the first complementary bit line are greater than or equal to the threshold value,
wherein a left connection transistor that connects a left node of the first memory cell to the first bit line and a right connection transistor that connects a right node of the first memory cell to the first complementary bit line,
wherein a gate region of the left connection transistor and a gate region of the right connection transistor are connected together to one word line selected from among the first word line and the second word line, and
wherein both of the left connection transistor and the right connection transistor are turned on or off in response to a voltage applied to the selected one word line to which the left connection transistor and the right connection transistor are connected together.

12. The method of claim 11, wherein the first bit line and the first complementary bit line are orthogonal to the first word line and the second word line.

13. The method of claim 11, wherein the read voltage corresponds to a power supply voltage and the read inhibit voltage corresponds to a ground supply voltage.

14. The method of claim 11, wherein each of the first memory cell and a second memory cell comprises a static random access memory (SRAM) cell.

15. The method of claim 11, wherein each of the first memory cell and a second memory cell comprises a latch circuit including four transistors.

16. The method of claim 11,
wherein the right node of the first memory cell is electrically connected to the first word line through a gate region of the right connection transistor of the first memory cell, and
wherein the left node of the first memory cell is electrically connected to the first word line through a gate region of the left connection transistor of the first memory cell.

17. The method of claim 16, wherein the right node of the first memory cell and the left node of a second memory cell are electrically connected to each other through the right connection transistor of the first memory cell and a left connection transistor of the second memory cell.

18. The method of claim 11, further comprising:
detecting the value of the data stored in the memory cell pair in the non-volatile manner to be 0 when both of the voltage level of the first bit line and the voltage level of the first complementary bit line are less than the threshold value.

19. The method of claim 11, wherein the detecting of the value of the data stored in the memory cell pair in the non-volatile manner to be 1 comprises performing an AND operation on a logic value of the first bit line and a logic value of the voltage level of the first complementary bit line.

* * * * *